United States Patent
White

(10) Patent No.: US 6,904,443 B2
(45) Date of Patent: Jun. 7, 2005

(54) HARMONIC-SERIES FILTER

(75) Inventor: Stanley A. White, San Clemente, CA (US)

(73) Assignee: Honeywell International Inc., Morristown, NJ (US)

( * ) Notice: Subject to any disclaimer, the term of this patent is extended or adjusted under 35 U.S.C. 154(b) by 753 days.

(21) Appl. No.: 09/928,512

(22) Filed: Aug. 13, 2001

(65) Prior Publication Data

US 2003/0061251 A1 Mar. 27, 2003

(51) Int. Cl.$^7$ .............................................. G06F 17/10
(52) U.S. Cl. .................................................... 708/310
(58) Field of Search ........................................ 708/310

(56) References Cited

U.S. PATENT DOCUMENTS

| | | | | |
|---|---|---|---|---|
| 4,420,815 A | * | 12/1983 | Francis | 708/310 |
| 4,679,001 A | * | 7/1987 | West | 327/556 |
| 4,947,360 A | * | 8/1990 | Dyer | 708/310 |
| 5,265,042 A | * | 11/1993 | Smith, Jr. | 708/310 |
| 5,444,639 A | | 8/1995 | White | |
| 5,577,073 A | | 11/1996 | White | |
| 5,587,910 A | | 12/1996 | Woodard | |
| 5,610,848 A | * | 3/1997 | Fowell | 708/310 |
| 5,675,498 A | | 10/1997 | White | |

OTHER PUBLICATIONS

Article entitled "The Digital All–Pass Filter: A Versatile Signal Processing Building Block", Author: Phillip A. Regalia, Sanjit K. Mitra, P.P. Vaidyanathan, Found in the Proceedings of the IEEE, vol. 76, No. 1, Jan. 1988.

Article entitled "Digital Lattice And Ladder Filter Synthesis", Author: A.H. Gray, Jr., Member, IEEE, and John D. Market, Member, IEEE, Found in the IEEE Transactions On Audio And Electroacoustics, vol. AU–21, No. 6, Dec. 1973, All pages.

R. E. Best, "Phase–Locked Loops", Design, Simulation, & Application, Fourth Edition, Chapter 5, McGraw Hill, pp. 229–249.

International Search Report in PCT/US02/23715, dated Oct. 29, 2002.

N.K. M'Sirdi et al., "Adaptive Comb Filters Implementation for Harmonic Signals", Signal Processing IV: Theories and Applications, Sep. 5, 1988, pp. 195–198.

S.–C. Pei et al., "Real time cascade adaptive notch filter scheme for sinusoidal parameter estimation", Signal Processing, Sep. 1, 1994, pp. 117–130.

* cited by examiner

*Primary Examiner*—D. H. Malzahn
(74) *Attorney, Agent, or Firm*—Schiff Hardin LLP

(57) ABSTRACT

In a filtering system, a first input receives a signal contaminated with noise. A second input receives a noise reference signal. Each notch filter in a set of M notch filters is responsive to a corresponding tuning coefficient so as to attenuate a corresponding noise frequency in the signal contaminated with noise. A tuning parameter generator responds to the noise reference signal by generating a tuning parameter corresponding to a fundamental frequency of the noise and tracks that fundamental frequency. A filter coefficient generator responds to the tuning parameter by providing each of the M notch filters with the corresponding tuning coefficient. A gain normalizer adjusts the overall gain of the M notch filters.

37 Claims, 3 Drawing Sheets

US 6,904,443 B2

HARMONIC-SERIES FILTER

TECHNICAL FIELD OF THE INVENTION

The present invention relates in general to a series of filters to filter out a fundamental frequency and its harmonics.

BACKGROUND OF THE INVENTION

Closed loop control systems are used in a wide variety of applications and generally provide good control. However, when sources of noise contaminate the control signals in closed loop systems, such closed loop control systems may fail to operate properly. The noise in a noise contaminated closed loop control systems often may be characterized by a slowly time-varying fundamental frequency component $f_0$ plus its harmonics. Such noise, for example, may be introduced into the control system by a nearby motor drive line.

Where noise contaminates the control signals of a closed loop control system to the point where the control system fails to operate properly, it is necessary to prevent or eliminate the noise. Generally, noise can be prevented from being introduced into the control system such as through the use of shielding, or noise can be removed from the control signals of the control system such as by the use of filtering. Shielding is often impractical, and filtering often introduces signal impairments which can be as bad or worse than the noise. As an example of the latter problem, noise removal by lowpass filtering is often not acceptable because of the amplitude and phase distortion introduced by the lowpass filter and because of the destabilizing influence of the resulting increased phase lag on the closed-loop system.

A low phase shift, low distortion noise attenuation type of filter has the potential of providing a better solution to the noise problem. Very narrow band low distortion notch filtering for the removal of a single spectral noise component are also well known. Moreover, it is known to interconnect such notching filters in order to remove plural offending noise components. However, it has not been known how to tune the notch filter sections so that the time- varying noise components are effectively filtered. Moreover, known narrow band notch filters are complex and do not combine simplicity, low coefficient sensitivity, low roundoff noise generation and propagation, and/or simple scaling for a wide dynamic range.

The present invention, therefore, is directed to a harmonic series filter which overcomes one or more of the problems of the prior art.

SUMMARY OF THE INVENTION

In accordance with one aspect of the present invention, a filtering system comprises first and second inputs, a set of M notch filters, a tuning parameter generator, a filter coefficient generator, and a gain normalizer. The first input receives a signal contaminated with noise. The second input receives a noise reference signal. Each of the M notch filters responds to a corresponding tuning coefficient by attenuating a corresponding noise frequency in the signal contaminated with noise. Based on the noise reference signal, the tuning parameter generator generates a tuning parameter corresponding to a fundamental frequency of the noise. The filter coefficient generator responds to the tuning parameter so as to provide each of the M notch filters with the corresponding tuning coefficient. The gain normalizer adjusts an overall gain of the M notch filters.

In accordance with another aspect of the present invention, a method comprises the following: generating a tuning parameter corresponding to a fundamental frequency of noise in a signal contaminated with the noise; generating tuning coefficients $\beta_1, \beta_2, \beta_3, \ldots, \beta_N$ in response to the tuning parameter, wherein the tuning coefficients $\beta_1, \beta_2, \beta_3, \ldots, \beta_N$ correspond to the fundamental frequency and to harmonics of the fundamental frequency; and, filtering the signal with notches positioned at frequencies determined by the tuning coefficients $\beta_1, \beta_2, \beta_3, \ldots, \beta_N$ so that the noise is attenuated.

In accordance with yet another aspect of the present invention, a notch filter comprises an input, an output, first, second, third, fourth, and fifth summers, first and second multipliers, and first and second delays. The input receives an input signal contaminated with noise, and the noise has a fundamental frequency. The output provides an output signal from the notch filter, and the output signal is substantially free of a harmonic of the fundamental frequency of the noise. The first summer sums the input signal with an output of the first delay, and the first summer has an output providing the output signal. The first multiplier multiplies the output signal by a gain coefficient. The second summer subtracts an output of the first multiplier from the input signal. The third summer subtracts an output of a second delay from an output of the second summer. The second multiplier multiplies an output of the third summer by a tuning coefficient related to the harmonic. The fourth summer subtracts an output of the second multiplier from the output of the second summer, and the fourth summer has an output coupled as an input to the second delay. The fifth summer subtracts the output of the second multiplier from the output of the second delay, and an output of the fifth summer is coupled as an input to the first delay.

In accordance with still another aspect of the present invention, a notch filter applies a transfer function F(z,n) to an input signal contaminated with noise in order to produce an output signal in which a harmonic of the noise is attenuated. The transfer function F(z,n) is defined by the following equation:

$$F(z, n) = \frac{1 - 2\beta_n z^{-1} + z^{-2}}{1 - \beta_n(1+\alpha)z^{-1} + \alpha z^{-2}}$$

where n designates the harmonic, $\beta_n$ is a tuning coefficient related to a center frequency of a bandwidth of the notch filter, $\alpha$ is a quantity related to the bandwidth of the notch filter, $z^{-1}$ represents a first order delay, and $z^{-2}$ represents a second order delay.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
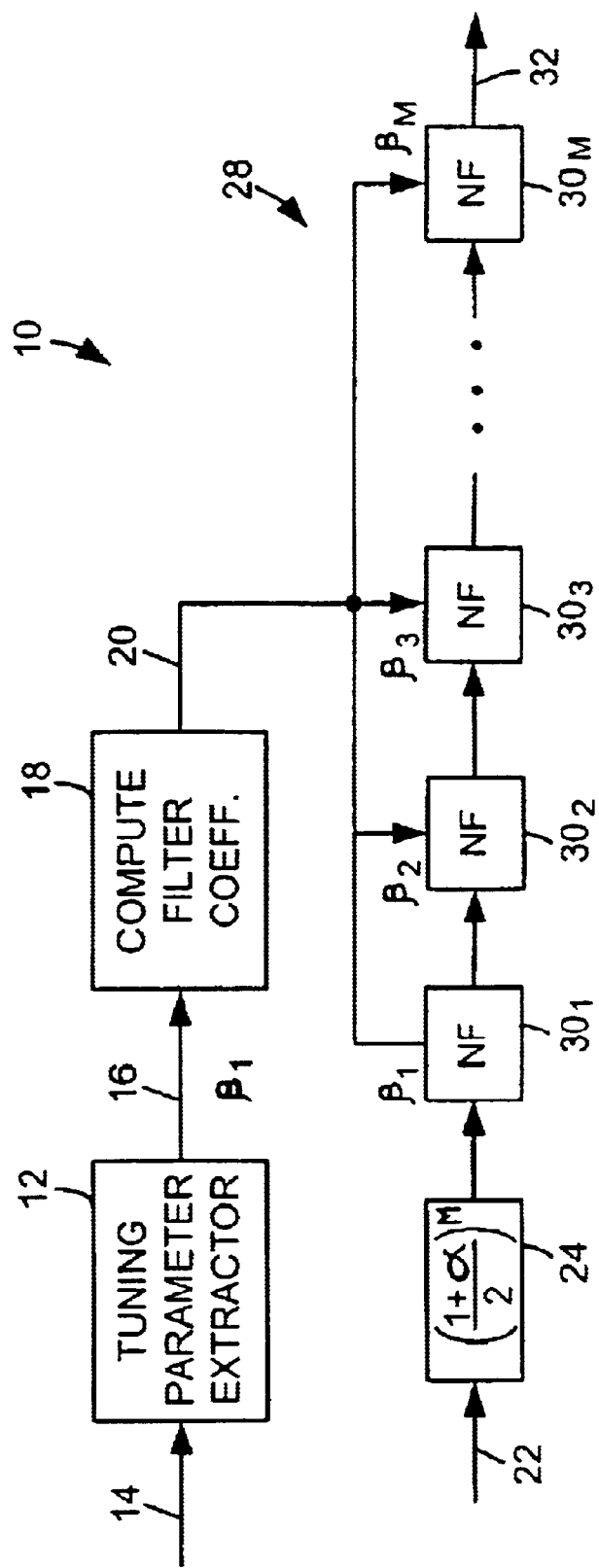
FIG. 1 shows an overview of a filtering system according to one embodiment of the present invention.

FIG. 1 shows a filtering system 10 for filtering out the fundamental and harmonic frequency components of noise introduced into a signal by a source of noise, such as a nearby motor drive line. The filtering system 10, for example, may be digital filtering system whose sampling period is T. The filtering system 10 includes a tuning parameter extractor 12 which receives a noise reference signal on an input 14. This noise reference signal may be provided, for example, by a monitor positioned to pick up the noise emanating from the noise source of concern. One of the advantages of using a noise reference signal is that the filtering system 10 can then follow any changes in phase or frequency of the noise. Thus, the filtering system 10 adapts to the noise environment.

The tuning parameter extractor 12 may be a phase-locked loop or a frequency-locked loop that derives the fundamental frequency $f_0$ of the noise reference signal and then provides a tuning parameter $\beta_1$ on an output 16 based upon the fundamental frequency $f_0$ in accordance with the following equation:

$$\beta_1 = \cos(20\pi f_0 nT) \tag{1}$$

where T is the sampling period.

The output 16 of the tuning parameter extractor 12 is coupled to an input of a filter coefficient computer 18 which provides, on a tuning coefficient bus 20, a set of filter tuning coefficient $\beta_n$ for $n = 1, 2, 3, \ldots, N$ in accordance with the following equation:

$$\beta_n = \cos(2\pi f_0 nT) \tag{2}$$

where N is the number of possible harmonics.

Depending on the noise source, one or more of the N harmonics of the noise fundamental frequency may not be present in the noise signal. If such a source is the noise source of concern, it is necessary to use only the tuning coefficients corresponding to the M harmonics that are present, such that the tuning coefficients corresponding to the others of the N possible harmonics that are not present may be ignored. The fundamental frequency of the noise is $f_0$ and the frequencies of the N harmonics of the noise fundamental frequency are $f_{n=nf_0}$ where $n = 1, 2, \ldots, N$. The notch-filter tuning coefficients for attenuating these interfering frequency components are defined in accordance with the following equation:

$$\beta_n = \cos(2\pi f_n T) \tag{3}$$

If some harmonics are absent, only M<N frequency components ($f_m$ where $m = 1, 2, \ldots, M$) are present, and the required notch-filter tuning coefficients are given by the following equation:

$$\beta_m = \cos(2\pi f_m T) \tag{4}$$

However, as will be understood from the above, although each $f_m$ is an integer multiple of $f_0$, generally $f_m \neq mf_0$. Although the filter coefficient computer 18 generates all N values of $\beta$, only the M required values are output onto the tuning coefficient bus 20. Therefore, the filter coefficient computer 18 contains instructions that determine which output samples $\beta_1, \beta_2, \beta_3, \ldots, \beta_N$ are to be provided on the tuning coefficient bus 20. These instructions are based on the frequencies known to be in the noise signal.

The noise contaminated input signal is received on an input 22. A gain normalizer 24 attenuates the noise contaminated input signal in accordance with the following equation:

$$\left[\frac{(1+\alpha)}{2}\right]^M \tag{5}$$

The quantity $\alpha$ in equation (5) is given by the following equation:

$$\alpha = \frac{1 - \tan(\pi f_{BW} T)}{1 + \tan(\pi f_{BW} T)} \tag{6}$$

where $\alpha$ is the common bandwidth parameter for each filter stage. The common −3 dB bandwidth (in Hz) of each notch filter is the desired bandwidth $f_{BW}$. The gain normalizer 24 provides the attenuated noise contaminated input signal on an output 26 which is coupled to a filter bank 28 comprising the M required notch filters $30_1, 30_2, 30_3, \ldots 30_M$ coupled in tandem. An output 32 from the last notch filter $30_M$ is a substantially noise free version of the signal on the input 22 with little phase and amplitude distortion.

Figure 2:
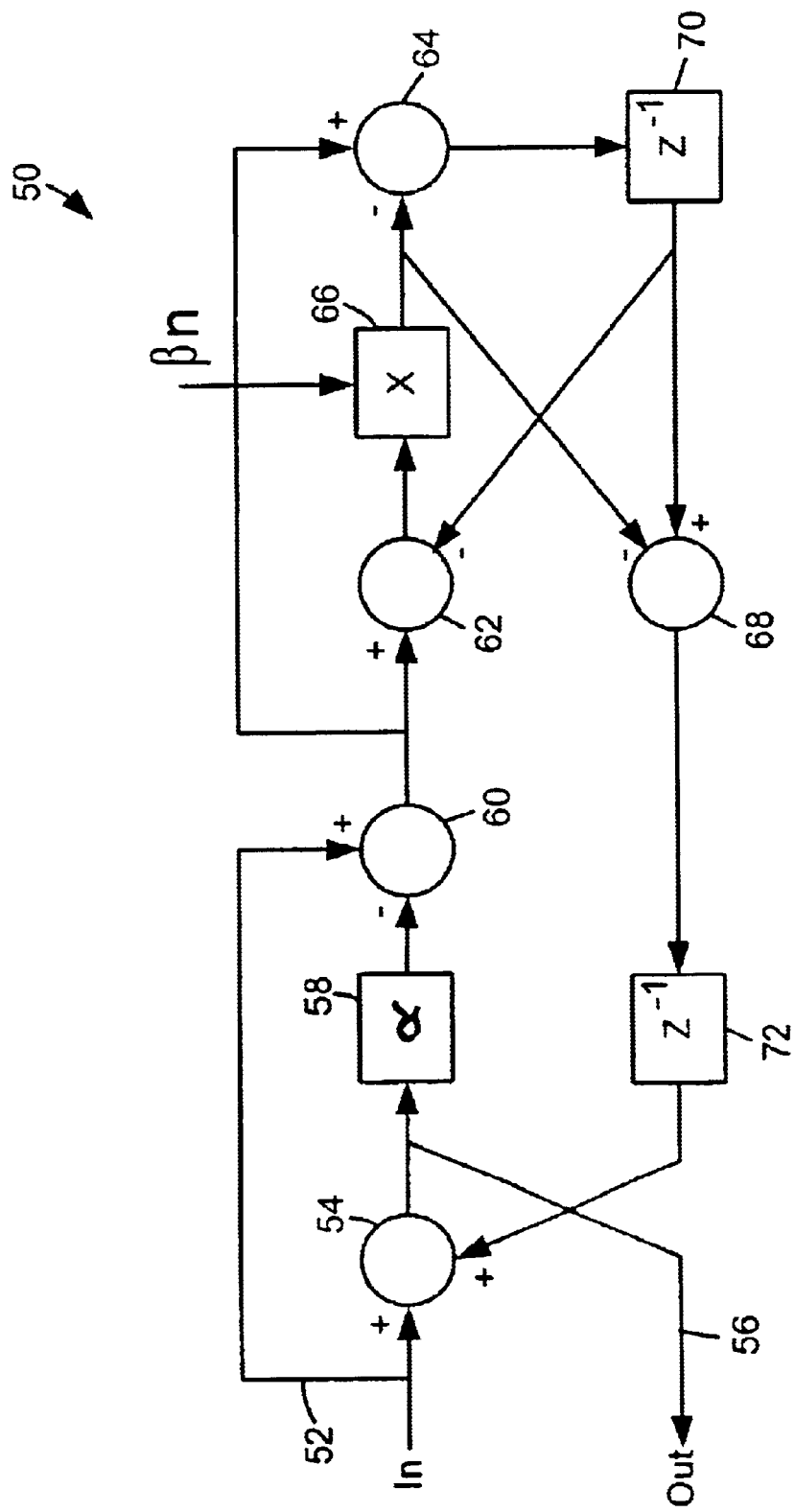
FIG. 2 shows in additional detail a representative one of the notch filters of the filtering system shown in FIG. 1; and, FIG. 3 shows in additional detail the filter coefficient computer of FIG. 2.

A notch filter 50 is shown in FIG. 2 and may be used for each of the notch filters $30_1, 30_2, 30_3, \ldots 30_M$ shown in FIG. 1. Each of the notch filters $30_1, 30_2, 30_3, \ldots 30_M$ is a second-order single-multiplier-per-order Gray-Markel lattice all-pass filter based upon the filters shown by A. H. Gray, Jr. and J. D. Markel in "Digital lattice and ladder filter synthesis," *IEEE Trans. on Audio and Electroacoustics*, vol. AU-21, December 1973; pp. 491–500, although the notch filter 50 could be based on any of the other n-multiplier per order filters described therein. P. A. Regalia, S. K. Mitra, and P. P. Vaidyanathan, in "The digital allpass filter; a versatile building block," *Proc. IEEE*, vol. 76, January, 1988; pp. 19–37, have shown that all pass filters may be interconnected in interesting ways to produce standard filtering functions with reduced complexity and high precision. Furthermore, U.S. Pat. No. 5,587,910 has shown a sign-assignment protocol that gives maximum dynamic range to a Gray-Markel lattice filter section.

The transfer function of the notch filter 50 shown in FIG. 2 is given by the following equation:

$$F(z, n) = \frac{1 - 2\beta_n z^{-1} + z^{-2}}{1 - \beta_n(1+\alpha)z^{-1} + \alpha z^{-2}} \tag{7}$$

where $\beta_n$ is the tuning coefficient supplied to the notch filter 50 and $\alpha$ is given by equation (6). The notch filter 50 implements this transfer function in a simple manner and with a large dynamic range. The zero frequency gain for the transfer function of equation (7) is given by the following:

$$\frac{2}{1+\alpha} \geq 1 \tag{8}$$

where the −3 dB notch-width parameter a is common to all of the filter sections and is given by equation (6) and where the −3 dB notch width in Hz is $f_{BW}$.

The input signal on an input 52 of the notch filter 50 is coupled to a first positive input of a first summer 54. The output of the first summer 54 delivers the output of the notch filter 50 on an output 56 and is also coupled to a bandwidth scaling multiplier 58 that applies the quantity a to the output of the first summer 54. The bandwidth scaling multiplier 58 sets a −3 dB notch bandwidth on the notch implemented by the notch filter 50 in accordance with a. The output of the bandwidth scaling multiplier 58 is coupled to a negative input of a second summer 60. The input signal on the input 52 of the notch filter 50 is also coupled to a positive input of the second summer 60.

The output of the second summer 60 is coupled to a positive input of a third summer 62 and to a positive input of a fourth summer 64. The output of the third summer 62 is coupled to a tuning coefficient multiplier 66 which forms the product of the output of third summer 62 and the tuning coefficient $\beta_n$ from the tuning coefficient bus 20. The output of tuning coefficient multiplier 66 is coupled to a negative input of the fourth summer 64 and to a negative input of a fifth summer 68. The output of fourth summer 64 is coupled as an input of a first single-sample-period-delay element 70 whose output is connected to a negative input of the third summer 62 and to a positive input of the fifth summer 68. The output of the fifth summer 68 is coupled to a second single-sample-period-delay element 72 whose output is coupled to a second positive input of the first summer 54.

The notch filter 50 shown in FIG. 2 is a narrow band notch filter that is centered on the $n_{th}$ harmonic of the fundamental noise frequency as determined by the tuning coefficient $\beta_n$. Thus, each of the notch filters $30_1, 30_2, 30_3, \ldots 30_M$ filters out a corresponding fundamental or harmonic frequency of the noise signal at the input 22 to produce a substantially noise free signal at the output 32.

Figure 3:
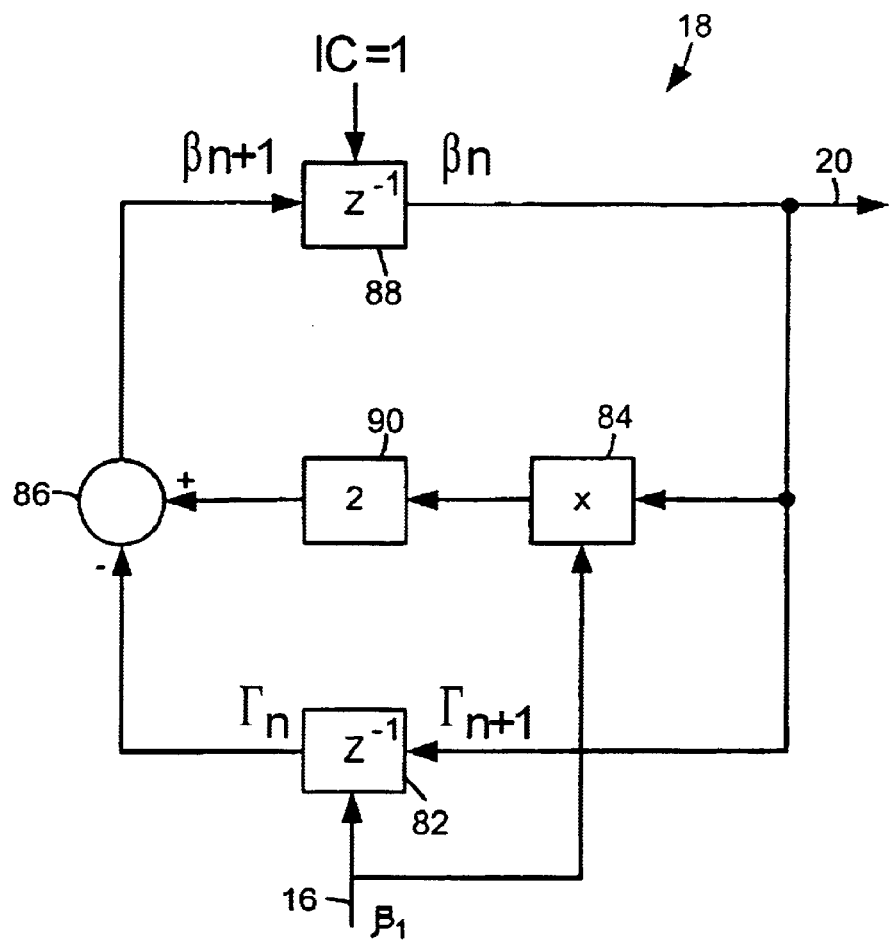

The filter coefficient computer 18 as shown in FIG. 3 is implemented as a second order recursive loop. The fundamental frequency tuning parameter $\beta_1$ provided by the tuning parameter extractor 12 is supplied as the initial condition to a first single-sample-period delay element 82 and also to a first input of a multiplier 84. An output $\Gamma_n$, from the first single-sample-period delay element 82 is coupled to a negative input of a summer 86. The output of the summer 86 is coupled as an input to a second single-sample-period delay element 88 whose initial condition is set to unity. The output of the second single-sample-period delay element 88 is coupled to a second input of the multiplier 84 and to the $\Gamma_{n+1}$ input of the first single-sample-period delay element 82. Also, the output of the second single-sample-period delay element 88 provides the tuning coefficients $\beta_1, \beta_2, \beta_3, \ldots, \beta_N$ over the tuning coefficient bus 20. The output of the multiplier 84 is coupled through a multiply-by-two device 90 to a positive output of the summer 86. Accordingly, the filter coefficient computer 18 recursively generates the tuning parameters $\beta_1, \beta_2, \beta_3, \ldots, \beta_N$ and provides these tuning parameters over the tuning coefficient bus 20.

Certain modifications of the present invention will occur to those practicing in the art of the present invention. For example, the present invention has been described above in terms of eliminating noise from such noise sources as a motor drive line. However, it should be understood from the above description that the filter of the present invention may be used to filter out noise from other sources as well.

Moreover, the embodiment of the present invention described above includes certain hardware components as shown in FIGS. 1–3. The present invention can be implemented, however, using a computer, a digital signal processor, a neural network, one or logic arrays, etc.

As described above, the tuning parameter extractor 12 extracts a tuning parameter $\beta_1$, and the filter coefficient computer 18 is a second order recursive loop which recursively generates the tuning coefficients $\beta_1, \beta_2, \beta_3, \ldots, \beta_N$ using the tuning parameter 1 as an input. Instead, the tuning parameter extractor 12 may be arranged to simply extract the noise fundamental frequency $f_0$ as the tuning parameter, and the filter coefficient computer 18 may be arranged to implement equation (2) directly in order to generate the tuning coefficients $\beta_1, \beta_2, \beta_3, \ldots, \beta N$ from upon the tuning parameter $f_0$.

Furthermore, as described above, the filter bank 28 is shown as including the notch filters $30_1, 30_2, 30_3, \ldots 30_M$. Thus, a determination is made beforehand as to which noise frequencies will be present and which ones will not be present in the noise generated by the noise source. The tuning coefficient bus 20 is then arranged to deliver only the tuning coefficients generated by the filter coefficient computer 18 that correspond to the noise frequencies which are predicted to be present. These noise frequencies may change as the noise fundamental frequency changes. However, any changes in the noise fundamental frequency are tracked and are used to suitably adjust the tuning coefficients.

On the other hand, if it cannot be predicted which noise frequencies will be in the noise generated by the noise source, a harmonic analyzer can be used to determine which harmonics are present in the noise reference signal on the input 14. In this case, the filter bank 28 should contain the notch filters $30_1, 30_2, 30_3, \ldots 30_N$ where N represents the maximum number of noise frequencies likely to be encountered in the noise reference signal received over the input 14. The output of the harmonic analyzer can then be used to control the tuning coefficient bus 20 to deliver to the required number of notch filters the tuning coefficients corresponding to the actual noise frequencies and to by-pass the unneeded notch filters, if any.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A filtering system comprising:

a first input that receives a signal contaminated with noise;

a second input that receives a noise reference signal;

a set of M notch filters, wherein each of the M notch filters is responsive to a corresponding tuning coefficient so as to attenuate a corresponding noise frequency in the signal contaminated with noise;

a tuning parameter generator coupled to the second input, wherein the tuning parameter generator is arranged to generate a tuning parameter corresponding to a fundamental frequency of the noise based on the noise reference signal;

a filter coefficient generator coupled to the tuning parameter generator and to each of the M notch filters, wherein the filter coefficient generator is responsive to the tuning parameter so as to provide each of the M notch filters with the corresponding tuning coefficient; and, a gain normalizer coupled to the M notch filters and to the first input, wherein the gain normalizer is arranged to adjust an overall gain of the M notch filters.

2. The apparatus of claim 1 wherein the signal contaminated with noise comprises a digital signal.

3. The apparatus of claim 1 wherein each of the M notch filters comprises a second-order single-multiplier-per-order Gray-Markel lattice filter having an α coefficient multiplier arranged to set a −3 dB notch bandwidth of the corresponding filter and having a coefficient multiplier arranged to set the center frequency of the corresponding notch in response to the corresponding tuning coefficient.

4. The apparatus of claim 3 wherein the −3 dB bandwidth of each of the M notch filters is $f_{BW}$, wherein the −3 dB bandwidth is determined by setting α in accordance with the following equation:

$$\alpha = \frac{1 - \tan(\pi f_{BW} T)}{1 + \tan(\pi f_{BW} T)}$$

and wherein T is a sampling period.

5. The apparatus of claim 4 wherein the gain of the gain normalizer is set in accordance with the following quantity:

$$\left[\frac{(1+\alpha)}{2}\right]^M.$$

6. The apparatus of claim 4 wherein the gain normalizer is coupled between the first input and a first of the M notch filters.

7. The apparatus of claim 3 wherein the −3 dB bandwidth of each filter is the same.

8. The apparatus of claim 1 wherein the tuning parameter generator comprises a frequency locked loop.

9. The apparatus of claim 1 wherein the tuning parameter generator comprises a phase locked loop.

10. The apparatus of claim 1 wherein the corresponding tuning coefficient supplied to an nth one of the M notch filter has a value in accordance with the following equation:

$$\beta_n = \cos(2\pi f_o n T)$$

wherein $\beta_n$ is the corresponding tuning coefficient supplied to the nth one of the M notch filter, wherein $f_o$ is the fundamental frequency of the noise, and wherein T is a sampling period.

11. The apparatus of claim 10 wherein the tuning parameter generated by the tuning parameter determination device is $\beta_1$.

12. The apparatus of claim 11 wherein the tuning parameter generator comprises a frequency locked loop.

13. The apparatus of claim 11 wherein the tuning parameter generator comprises a phase locked loop.

14. The apparatus of claim 11 wherein the tuning parameter $\beta_1$ is provided as an input to the filter coefficient generator.

15. The apparatus of claim 14 wherein the filter coefficient generator comprises a second-order recursive loop whose successive output samples are $\beta_1, \beta_2, \ldots \beta_N$, wherein the Nth harmonic is the highest frequency of interest, and wherein the input to the filter coefficient generator provides a multiplier coefficient and an initial condition to the second-order recursive loop.

16. The apparatus of claim 15 wherein the filter coefficient generator contains instructions that determine which of the N output samples are to be supplied to the M notch filters such that M≦N.

17. The apparatus of claim 16 further comprising a data bus coupled between the output of the filter coefficient generator and the M notch filters, and wherein the M≦N output samples from the filter coefficient generator are loaded via the data bus into notch filter multipliers of the M notch filters.

18. A method comprising:
generating a tuning parameter corresponding to a fundamental frequency of noise in a signal contaminated with the noise;
generating tuning coefficients $\beta_1, \beta_2, \beta_3, \ldots, \beta_M$ in response to the tuning parameter, wherein the tuning coefficients $\beta_1, \beta_2, \beta_3, \ldots, \beta_M$ correspond to the fundamental frequency and to harmonics of the fundamental frequency; and,
filtering the signal with notches positioned at frequencies determined by the tuning coefficients $\beta_1, \beta_2, \beta_3, \ldots, \beta_M$ that the noise is attenuated.

19. The method of claim 18 wherein the filtering of the signal imposes a gain on the signal, wherein the method further comprises normalizing the signal prior to the filtering, and wherein the normalizing is based on the gain imposed on the signal.

20. The method of claim 18 wherein the signal contaminated with noise comprises a digital signal contaminated with noise.

21. The method of claim 18 wherein the filtering of the signal comprises:
multiplying the signal by a gain coefficient; and,
multiplying the signal by the tuning coefficients $\beta_1, \beta_2, \beta_3, \ldots, \beta_M$.

22. The method of claim 21 wherein the multiplying of the signal by the gain coefficient sets a bandwidth of the notches, and wherein the multiplying of the signal by the tuning coefficients $\beta_1, \beta_2, \beta_3, \ldots, \beta_M$ sets a center frequency of the notches.

23. The method of claim 18 wherein the filtering of the signal is performed in stages and wherein each stage comprises:
multiplying the signal by a gain coefficient; and,
multiplying the signal by a corresponding one of the tuning coefficients $\beta_1, \beta_2, \beta_3, \ldots, \beta_M$.

24. The method of claim 23 wherein the multiplying of the signal by the gain coefficient sets a bandwidth of the notches, and wherein the multiplying of the signal by a corresponding one of the tuning coefficients $\beta_1, \beta_2, \beta_3, \ldots, \beta_M$ sets a center frequency of the notches.

25. The method of claim 24 wherein the bandwidth is $f_{BW}$, and wherein the bandwidth is determined by setting the gain coefficient in accordance with the following equation:

$$\alpha = \frac{1 - \tan(\pi f_{BW} T)}{1 + \tan(\pi f_{BW} T)}$$

wherein α is the gain coefficient, and wherein T is a sampling period.

26. The method of claim 25 wherein the filtering of the signal imposes a gain on the signal, wherein the method further comprises normalizing the signal prior to the filtering, wherein the normalizing is based on the gain imposed on the signal, wherein the gain of the gain normalizer is set in accordance with the following quantity:

$$\left[\frac{(1+\alpha)}{2}\right]^M.$$

27. The method of claim 18 wherein the generation of tuning coefficients $\beta_1, \beta_2, \beta_3, \ldots, \beta_M$ comprises generating the tuning coefficients $\beta_1, \beta_2, \beta_3, \ldots, \beta_M$ in accordance with the following equation:

$$\beta_n = \cos(2\pi f_o n T)$$

wherein $f_o$ is the fundamental frequency of the noise, wherein T is a sampling period, and wherein n varies from 1 to M.

28. A notch filter comprising:
an input that receives an input signal contaminated with noise, wherein the noise has a fundamental frequency;

an output that provides an output signal from the notch filter, wherein the output signal is substantially free of a harmonic of the fundamental frequency of the noise;

a first summer that sums the input signal with an output of a first delay, wherein the first summer has an output providing the output signal;

a first multiplier that multiplies the output signal by a gain coefficient;

a second summer that subtracts an output of the first multiplier from the input signal;

a third summer that subtracts an output of a second delay from an output of the second summer;

a second multiplier that multiplies an output of the third summer by a tuning coefficient related to the harmonic frequency;

a fourth summer that subtracts an output of the second multiplier from the output of the second summer, the fourth summer having an output coupled as an input to the second delay; and, a fifth summer that subtracts the output of the second multiplier from the output of the second delay, wherein an output of the fifth summer is coupled as an input to the first delay.

29. The notch filter of claim 28 wherein the gain coefficient sets a bandwidth of the notch filter, and wherein the tuning coefficient sets a center frequency of the notch filter.

30. The notch filter of claim 29 wherein the bandwidth is $f_{BW}$, and wherein the gain coefficient is determined in accordance with the following equation:

$$\alpha = \frac{1 - \tan(\pi f_{BW} T)}{1 + \tan(\pi f_{BW} T)}$$

wherein $\alpha$ is the gain coefficient, and wherein T is a sampling period.

31. The notch filter of claim 30 wherein a gain normalizing quantity is applied to the input signal upstream of the notch filter, and wherein the gain normalizing quantity is set in accordance with the following quantity:

$$\left[\frac{(1+\alpha)}{2}\right]^M.$$

32. The notch filter of claim 28 wherein the tuning coefficient has a value in accordance with the following equation:

$$\beta_n \cos(2\pi f_0 n T)$$

wherein $\beta_n$ is the tuning coefficient, wherein $f_0$ is the fundamental frequency of the noise, wherein n designates the harmonic, and wherein T is a sampling period.

33. The notch filter of claim 28 having a transfer function in accordance with the following equation:

$$F(z, n) = \frac{1 - 2\beta_n z^{-1} + z^{-2}}{1 - \beta_n(1 + \alpha)z^{-1} + \alpha z^{-2}}$$

wherein F(z,n) is the transfer function, wherein n designates the harmonic, wherein $\beta_n$ is the tuning coefficient, wherein $\alpha$ is a gain coefficient, wherein $z^{-1}$ represents a first order delay, and wherein $z^{-2}$ represents a second order delay.

34. A notch filter that applies a transfer function F(z,n) to an input signal contaminated with noise in order to produce an output signal in which a harmonic of the noise is attenuated, wherein the transfer function F(z,n) is defined by the following equation:

$$F(z, n) = \frac{1 - 2\beta_n z^{-1} + z^{-2}}{1 - \beta_n(1 + \alpha)z^{-1} + \alpha z^{-2}}$$

wherein n designates the harmonic, wherein $\beta_n$ is a turning coefficient related to a center frequency of a bandwidth of the notch filter, wherein $\alpha$ is a quantity related to the bandwidth of the notch filter, wherein $z^{-1}$ represents a first order delay, and wherein $z^{-1}$ represents a second order delay.

35. The notch filter of claim 34 wherein $\beta_n$ defines the center frequency of the bandwidth of the notch filter.

36. The notch filter of claim 34 wherein $\alpha$ defines the bandwidth of the notch filter.

37. The notch filter of claim 36 wherein $\beta_n$ defines the center frequency of the bandwidth of the notch filter.

* * * * *